United States Patent
Bonna et al.

(10) Patent No.: US 7,936,799 B2
(45) Date of Patent: May 3, 2011

(54) INTERLEAVING LASER BEAMS

(75) Inventors: Ulrich Bonna, Cranbury, NJ (US);
Martin Liermann, Villingen Schwenningen (DE); Viorel C. Negoita, Plainsboro, NJ (US); Thilo Vethake, Cranbury, NJ (US); Alexander Killi, Trossingen (DE); Christoph Tillkorn, Zimmern (DE)

(73) Assignee: Trumpf Photonics Inc., Cranbury, NJ (US)

( * ) Notice: Subject to any disclaimer, the term of this patent is extended or adjusted under 35 U.S.C. 154(b) by 221 days.

(21) Appl. No.: 12/258,622

(22) Filed: Oct. 27, 2008

(65) Prior Publication Data

US 2010/0103973 A1 Apr. 29, 2010

(51) Int. Cl.
*H01S 5/00* (2006.01)
(52) U.S. Cl. .................... 372/50.12; 372/50.23
(58) Field of Classification Search ............... 372/50.12, 372/50.23, 101
See application file for complete search history.

(56) References Cited

U.S. PATENT DOCUMENTS

| | | | |
|---|---|---|---|
| 4,826,269 A | 5/1989 | Streifer et al. | |
| 5,513,201 A | 4/1996 | Yamaguchi et al. | |
| 6,005,717 A | 12/1999 | Neuberger et al. | |
| 6,151,168 A | 11/2000 | Goering et al. | |
| 6,229,831 B1 | 5/2001 | Nightingale et al. | |
| 6,259,713 B1 | 7/2001 | Hwu et al. | |
| 6,331,692 B1 | 12/2001 | Krause et al. | |
| 6,516,011 B1 | 2/2003 | Treusch | |
| 6,771,686 B1 | 8/2004 | Ullman et al. | |
| 6,898,222 B2 | 5/2005 | Hennig et al. | |
| 6,975,465 B1 | 12/2005 | Chung et al. | |
| 7,065,105 B2 | 6/2006 | Ehlers et al. | |
| 7,773,653 B2 * | 8/2010 | Voss et al. ................. | 372/50.12 |
| 2003/0063639 A1 | 4/2003 | Yatskar et al. | |
| 2003/0099267 A1 | 5/2003 | Hennig et al. | |
| 2004/0252743 A1 | 12/2004 | Anikitchev et al. | |
| 2004/0257661 A1 | 12/2004 | Gao et al. | |
| 2006/0018356 A1 | 1/2006 | Voss et al. | |
| 2006/0103939 A1 | 5/2006 | Zheng et al. | |

FOREIGN PATENT DOCUMENTS

| | | |
|---|---|---|
| DE | 10061265 | 6/2002 |
| DE | 10229711 | 1/2004 |
| EP | 0106330 | 4/1984 |
| EP | 0902511 | 3/1999 |

(Continued)

OTHER PUBLICATIONS

Notification of the Transmittal of the International Search Report and The Written opinion of the International Searching Authority for the corresponding PCT Application No. PCT/US2009/061475, mailed Jan. 5, 2010, 20 pages.

(Continued)

*Primary Examiner* — Armando Rodriguez
(74) *Attorney, Agent, or Firm* — Fish & Richardson P.C.

(57) ABSTRACT

A laser system includes at least two sources configured to provide at least two spatially separated laser beams, and a mount configured to mount the at least two sources along an arc, the arc defining an angular coordinate and a radial coordinate, wherein an axial coordinate is orthogonal to the angular coordinate and the radial coordinate, and the spatially separated laser beams are separated in the axial coordinate. The mount is further configured to mount the at least two sources providing thereby an offset of the laser beams in the axial coordinate such that the laser beams interleave in the axial direction at a center region of the arc.

22 Claims, 7 Drawing Sheets

FOREIGN PATENT DOCUMENTS

| | | |
|---|---|---|
| EP | 1059713 | 12/2000 |
| EP | 1619765 | 7/2004 |
| JP | 2002151799 | 5/2002 |
| JP | 2002335047 | 11/2002 |
| JP | 2003124558 | 4/2003 |
| WO | WO0051211 | 8/2000 |
| WO | 0250599 | 6/2002 |
| WO | 02056074 | 7/2002 |

OTHER PUBLICATIONS

Notification of the Transmittal of the International Search Report and the Written opinion of the International Searching Authority for PCT Application No. PCT/US2009/061490, mailed Jan. 4, 2010, 18 pages.

* cited by examiner

INTERLEAVING LASER BEAMS

TECHNICAL FIELD

This invention relates to interleaving laser beams, for example, for a high power diode laser system.

BACKGROUND

Laser systems for a high-performance solid state laser can be based on laser diodes and laser diode bars. To provide a high pump power to, for example, a solid state laser medium of a disk laser, emitted laser beams of multiple laser diodes or laser diode bars are combined to form a pump laser beam.

SUMMARY

The systems and methods disclosed herein provide a simple and cost-effective way of combining laser beams, e.g., of laser diodes and laser diode bars in high power laser diodes applications.

In one aspect of the invention, a laser system includes at least two sources, each source configured to provide at least two spatially separated laser beams, and a mount configured to mount the at least two sources along a arc, the arc defining an angular coordinate and a radial coordinate, wherein an axial coordinate is orthogonal to the angular coordinate and the radial coordinate, and the spatially separated laser beams are separated in the axial coordinate. The mount is further configured to mount the at least two sources providing thereby an offset of the laser beams in the axial coordinate such that the laser beams interleave in the axial direction at a center region of the arc.

In another aspect, a beam forming system for interleaving laser beams of at least two sources includes a mount for at least two sources, the mount configured to have mounted thereon the at least two sources along an arc with an offset in an axial coordinate, the arc defining an angular coordinate and a radial coordinate, wherein the axial coordinate is orthogonal to the angular coordinate and the radial coordinate, such that laser beams provided from different sources of the at least two sources interleave in the axial coordinate at a center region of the arc, and an aligning optics in the center region to direct the interleaved laser beams in a common direction.

In another aspect, a method includes providing a first set of laser beams propagating in a radial direction towards a center region, the first set of laser beams being displaced in an axial coordinate of a cylindrical coordinate system, providing a second set of laser beams propagating in a radial direction of the cylindrical coordinate system towards the center region, the second set of laser beams being displaced in an axial coordinate, wherein in the axial coordinate, the laser beams of the first set of laser beams is interleaved with the laser beams of the second set of laser beams.

In another aspect, a laser system includes at least two sources, each source configured to provide at least two laser beams separated in an axial coordinate of a cylindrical coordinate system, the at least two sources being positioned along a circular arc at different angular coordinates and identical radial coordinates of the cylindrical coordinate system, wherein at least one of the sources includes a laser diode and a deflecting optics, wherein the laser diode is configured to emit a first laser beam of the at least two laser beams along the axial direction having its fast axis along the radial coordinate, and the deflecting optics is configured to deflect the first laser beam in a direction towards a center region of the cylindrical coordinate system, thereby changing the fast axis into the direction along the axial coordinate.

Implementations may include one or more of the following features.

One of the source of the at least two sources can be mounted for providing a laser beam that has an axial coordinate in between the axial coordinates of a pair of laser beams provided by another of the at least two sources.

An aligning optics can be positioned at the center region to direct the interleaved laser beams in a common direction. The aligning optics can include a stack of optical elements. Moreover, neighboring optical elements of the stack of optical elements can direct laser beams of different sources. Examples for the optical elements include flat mirrors, parabolic mirrors, and prisms.

The mount can be configured to mount six identical sources and the arc can be a circular arc.

The mount and the aligning optics can be configured to provide the same optical path length for the laser beams of the at least two sources.

At least one of the sources can include a stack of laser diode units.

At least one of the sources can include a heat sink and two laser diodes. In particular, at least one of the laser diodes can be arranged flat on the heat sink such that an emitting surface of the laser diode is perpendicular to the heat sink for emitting a laser beam parallel to the heat sink with a fast axis perpendicular to the heat sink. Moreover, a deflecting optics can be configured to deflect the laser beam being emitted parallel to the heat sink in a direction towards the center region.

The heat sink of one of the sources can be electrically insolated from the laser diodes with a ceramic layer.

The laser diodes of one of the sources can be electrically connected for supplying a current serially through all laser diodes.

The laser system can further include a beam forming optics positioned in the optical path of the interleaved laser beams after the aligning optics. Alternatively, or additionally, a beam forming optics can be partially or complete incorporated in the aligning optics.

The sources can be configured to provide multiple in the axial coordinate displaced laser beams with a pitch of at least the length of the laser diode in direction orthogonal to the emitting surface. The sources can be further configured to emit multiple vertically displaced laser beams with a pitch of several millimeters, for example, at least 5 mm, 10 mm, or 15 mm.

The laser system can further include a collimating optics for at least one of a fast axis and a slow axis of the emitted laser beams. The collimating optics can include a cylindrical optical telescope for adjusting the fast axis.

At least one of the laser diodes can be a laser diode bar. The laser diode bar can include, for example, between 20 and 50 emitting regions for emitting laser beams at the same axial coordinate. The emitting regions can be arranged over a width of about 10 mm.

The laser system can further include a folding mirror.

The beam forming system can be configured to provide the same optical path length for the laser beams.

The aligning optics can include a stack of optical elements and neighboring optical elements can be configured to direct laser beams of different sources.

The beam forming system can further include a collimating optics for at least one of the fast axis and the slow axis and/or a cylindrical optical telescope for adjusting the fast axis.

The mount and the sources can be configured such that in the center region and before interaction with the aligning optics, the directions of the fast axis of the laser beams provided by at least one of the sources can be along the axial coordinate and the direction of the slow-axis of the laser diodes can be perpendicular to the axial coordinate.

The beam forming device can be configured to provide a geometrically interleaved laser beam.

The method can further include pumping a laser medium with the interleaved laser beams.

The direction of a slow axis of the first laser beam can be tangentially to the circular arc.

Advantages of some of the embodiments can include a simple mechanical arrangement allowing a mounting of sources that is easy to align and gives direct access to individual sources, thereby improving, for example, the serviceability (e.g., replacement of a source).

Moreover, in some embodiments, laser light from a single source can contribute to various areas in the cross-section of the interleaved beam. Thus, malfunction of a single source can affect the pump beam at those spread out regions only. Accordingly, asymmetric effects to the pump beam and therefore to the pumped volume of the laser medium can be reduced.

In some embodiments of high power (pump) laser systems, sources can provide beams at a larger distance in order to increase the cooling performance for individual diode lasers. Specifically for such systems, the larger "radiation free" areas between (e.g., high power) laser beams can be filled with laser beams of the remaining sources of the system.

The details of one or more embodiments of the invention are set forth in the accompanying drawings and the description below. Other features and advantages of the invention will be apparent from the description and drawings, and from the claims.

DETAILED DESCRIPTION

A group of laser diodes or laser diode bars can be arranged to provide laser beams that are spatially separated. Herein, such an arrangement is referred to as a source of (stacked) laser beams. A source of stacked laser beams can therefore emit several laser beams that have similar beam parameters, i.e., similar parameters for the slow axis and the fast axis. By combining the laser beams of multiple sources of stacked laser beams, one can form a beam with a radiance that is higher than that for a single source of stacked laser beams, i.e., one can increase the power within a given area of the cross section of the beam. Appropriate beam forming elements can further be applied to improve the quality of the beam to allow, for example, efficient optical pumping of a laser medium.

Figure 1:
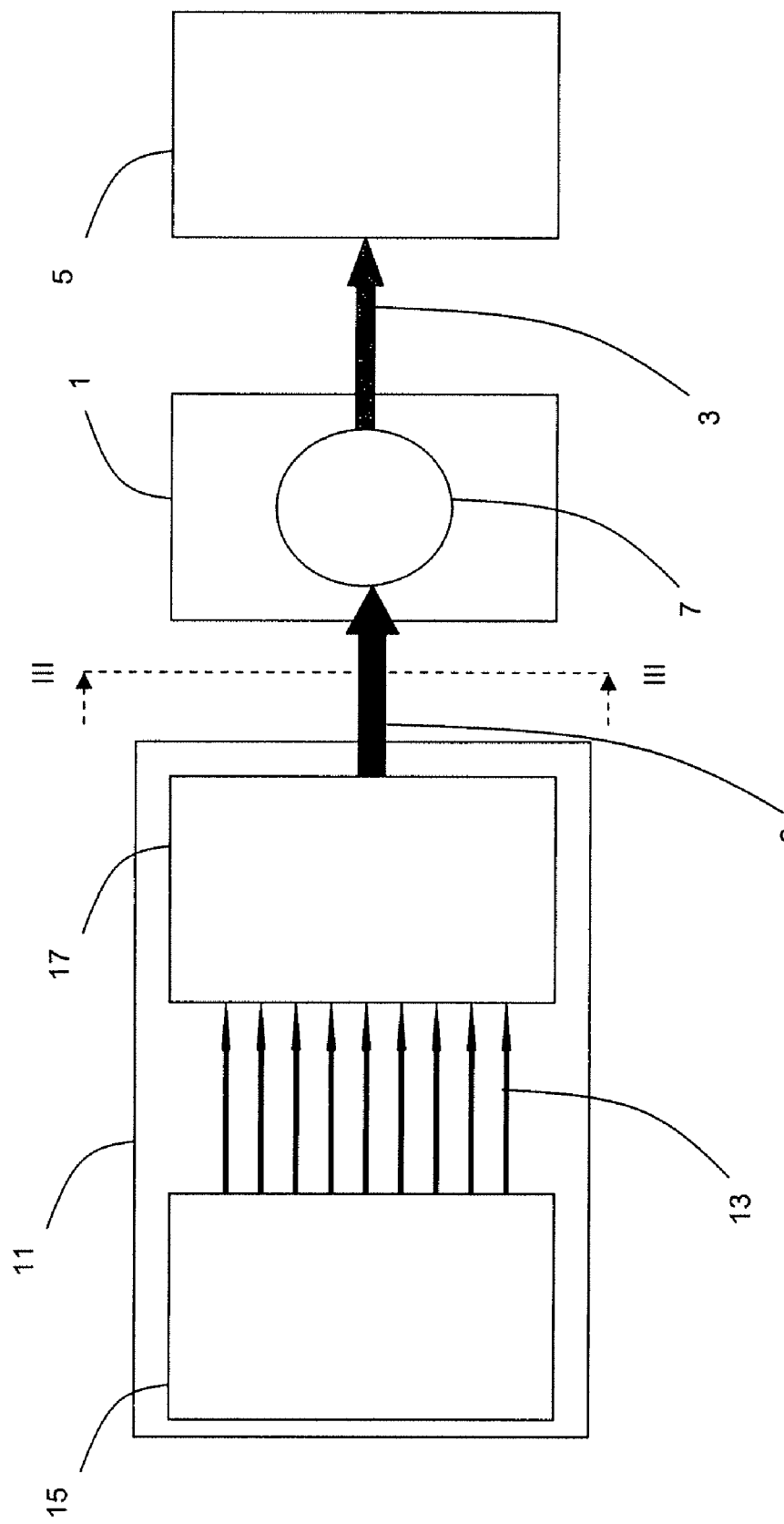
FIG. 1 is a schematic block diagram of an optically pumped laser system using an interleaved pump beam.

In FIG. 1, an optically pumped laser system 1 provides a high power laser beam 3 to a laser processing system 5 such as a laser cutting system or a laser welding system. For example, the laser system 1 can be a disk laser system that provides a several kW laser beam to the laser processing system 5. A further exemplary laser system can be a fiber laser. To generate the laser beam 3, a laser medium 7 of the laser system 1 is optically pumped with an interleaved beam 9 that is generated by a laser system 11. However, the pump laser system 11 could also be configured as an independent laser system that is used for laser applications, such as surface treatment, hardening, material processing, and soldering.

The laser system 11 includes, for example, a plurality of sources mounted in an arrangement 15 and beam forming optics 17. The arrangement 15 is configured to provide a laser beam grouping 13 of a plurality of laser beams, with each laser beam being displaced in one dimension and being directed in a direction that is different from the directions of the other laser beams of other sources. The beam forming optics 17 redirects the laser beams within the grouping 13 to travel in a common direction thereby forming the interleaved beam 9. Additionally, the beam forming optics 17 can include optics to collimate the laser beams within the grouping 13. The interleaved beam 9 is provided as a pump laser beam to the laser system 1, for example, directly or through a waveguide such as an optical fiber.

Figures 2, 3:
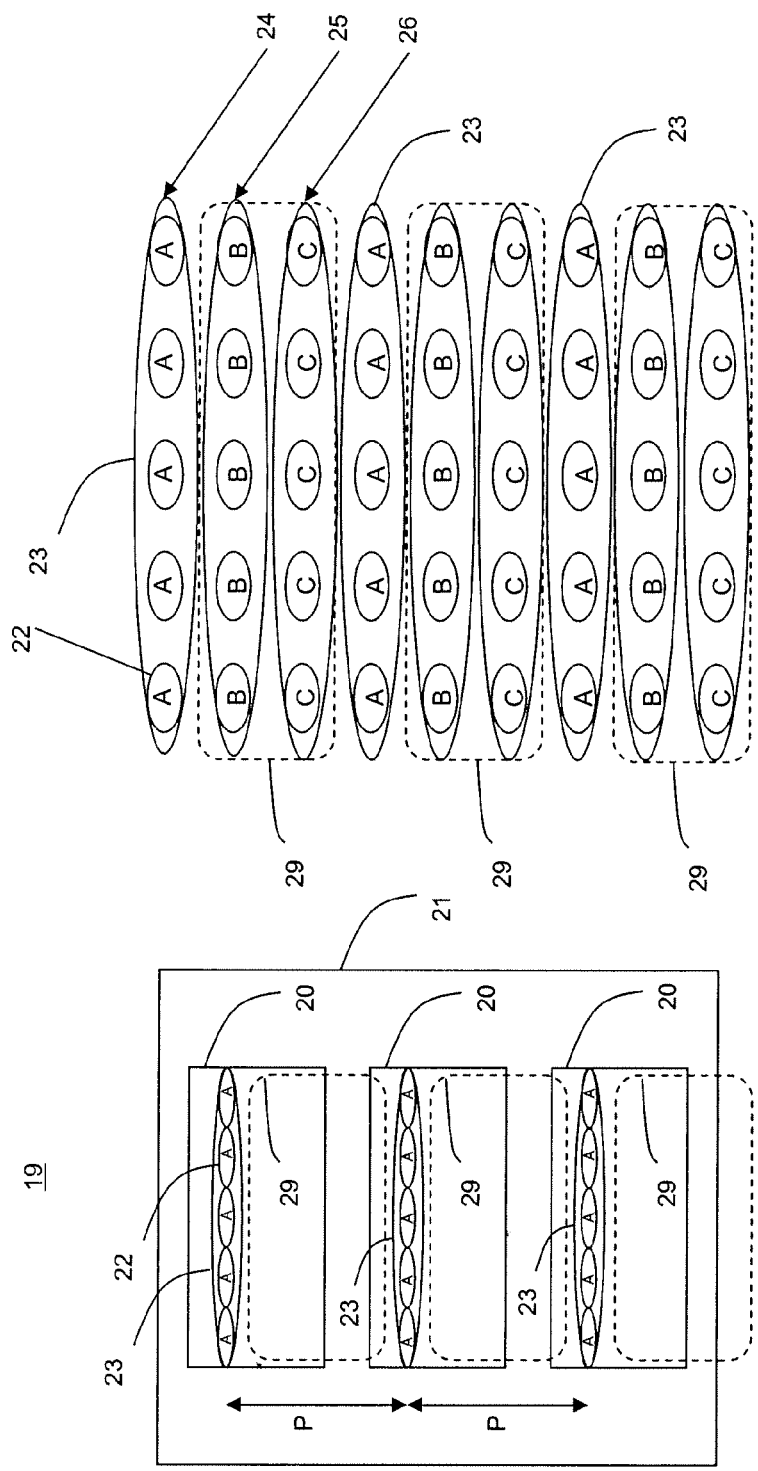
FIG. 2 is a schematic front view of a source that can be used in the laser system of FIG. 1.
FIG. 3 is a cross-sectional view of an interleaved pump beam shown in FIG. 1 taken along cross-section generated with three sources as shown in FIG. 2.

FIG. 2 shows schematically a source 19 that can be used in the arrangement 15. FIG. 3 illustrates a cross-section taken along view of the interleaved beam 9 of FIG. 1; this cross-section could be created with three of the sources 19 of FIG. 2. Various embodiments of interleaving laser systems are described in detail in connection with FIGS. 4-12 that can be used, for example, as the laser system 11 in FIG. 1.

As shown in FIG. 2, the exemplary source 19 includes three laser diode bars 20 that are mounted on a common heat sink 21. Each laser diode bar 20 includes a semiconductor structure with five neighboring emitting regions. The laser light of a single emitting region has an elliptical beam profile 22. The elliptic shape of the beam profiles 22 indicates the different optical properties of a fast axis and a slow axis of a laser beam. For example, the laser light of an emitting region diverges more in the direction of the fast axis due to the thinness of the emitting region than in direction of the slow axis.

The light of the five emitting regions forms a laser beam 23 of the laser beam grouping 13 and each laser beam 23 has an elongated shape. In some embodiments, the emitting regions emit light orthogonal to the heat sink 21, while in other embodiments the light can be, for example, first emitted parallel to the surface of the heat sink 21 and then deflected by, e.g., 90°.

In one dimension, the three laser diode bars 20 are displaced from each other by a pitch P and therefore the three laser beams 23 are also displaced by the pitch P. Thus, the three laser beams 23 emitted from a single source 19 form a beam having its own cross-section, the cross-section includes regions with laser light displaced by the pitch P and regions 29 without laser light in between the regions with laser light. Some high power sources provide laser beams at a large pitch of, e.g., several millimeters. Examples of such high power sources include a source with flat mounted laser diode bars (flat source) as described in connection with FIGS. 9-11 and an arrangement with stacked laser diode bars (group source) as described in connection with FIG. 12.

Interleaving laser systems can be specifically suited for the use of sources having a large pitch.

Referring again to FIG. 3, a simplified cross-section along the view of the interleaved beam 9 in FIG. 1 is based on three sources 19 with each source 19 having three laser diode bars 20 and with each laser diode bar 20 producing five laser beams 22 (as shown in FIG. 2). The laser system 11 interleaves the three laser beams 23 from each of the three laser diode bars 20 (for a total of nine laser beams in the grouping 13) such that, within the cross-section of the interleaved beam 9, light of neighboring rows of the beam originate from different sources 19. Within the cross-section, a single laser diode bar 20 of one of the sources 19 contributes to a row 24 in the cross-section indicated through the elliptical beam profiles 22 associated to the five emitting regions of the laser diode bar.

In the example of FIG. 3, three rows of laser beams originate from each of the three sources 19. For example, the row 24 and two other unlabeled rows relate to laser radiation A of a first source, the row 25 and two other unlabeled rows relate to laser radiation B of a second source, and the row 26 and two other unlabeled rows relate to laser radiation C of a third source. Accordingly, the radiation-free areas 29 in between the emitted light of the laser diode bars 20 of each of the sources 19 can be at least partially filled with laser radiation originating from the two remaining sources 19 of the arrangement 15. Thus, the laser radiation of a source 19 (for example, the laser radiation A from the first source 19) does not contribute to a single area of the cross-section of the interleaved beam 9 but contributes to different regions (labeled as row 24 or as radiation A) within the entire cross-section of the beam 9. Such a spreading of contributions to the cross-section from each of the sources is increased when sources with a larger number of laser diode bars are interleaved with each other.

The embodiments described in connection with FIGS. 4-12 illustrate such geometrical interleaving of laser beams 423 of six sources 419. In the embodiments, each of the sources 419 includes twelve laser diode bars emitting laser beams 423 that are spatially displaced by a pitch of ten millimeters. However, similar interleaving can also be performed for more or less sources having a smaller or larger pitch.

Figure 4:
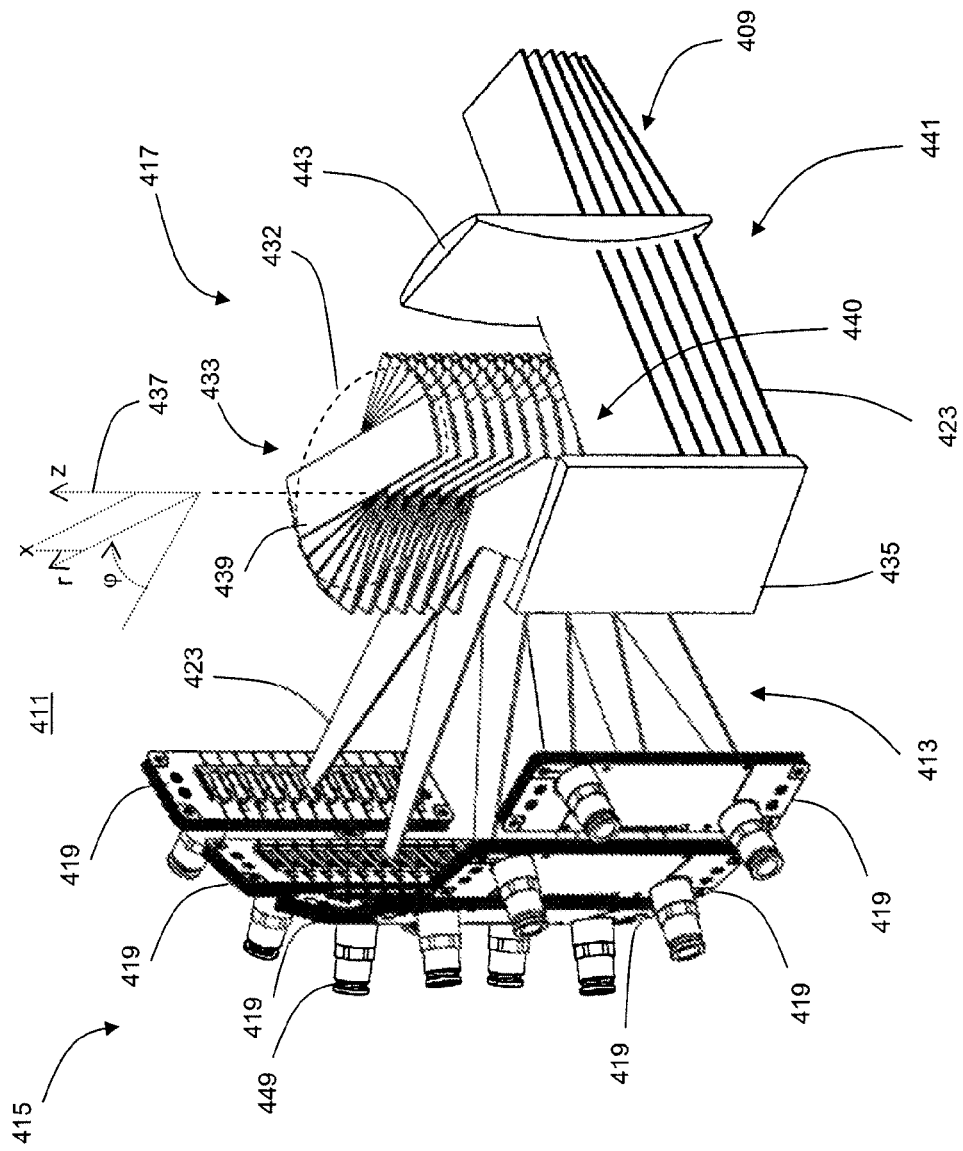
FIG. 4 is a perspective view of an implementation of a laser system that can be used in the laser system of FIG. 1.

Specifically, FIG. 4 shows a first embodiment of an interleaving laser system 411 with an arrangement 415 of six sources 419. The sources 419 are arranged side by side along a circular arc thereby surrounding a wall portion of an imaginary cylinder. Each of the sources 419 is configured to emit the laser beams 423 from each of the diode laser bars towards a center region 432 of an imaginary cylinder. In the center region 432, the laser beams 423, which are propagating from different directions, are interleaved and the beam forming optics 417 captures the interleaving and aligns the laser beam 423 to propagate in the same direction.

Figure 5:
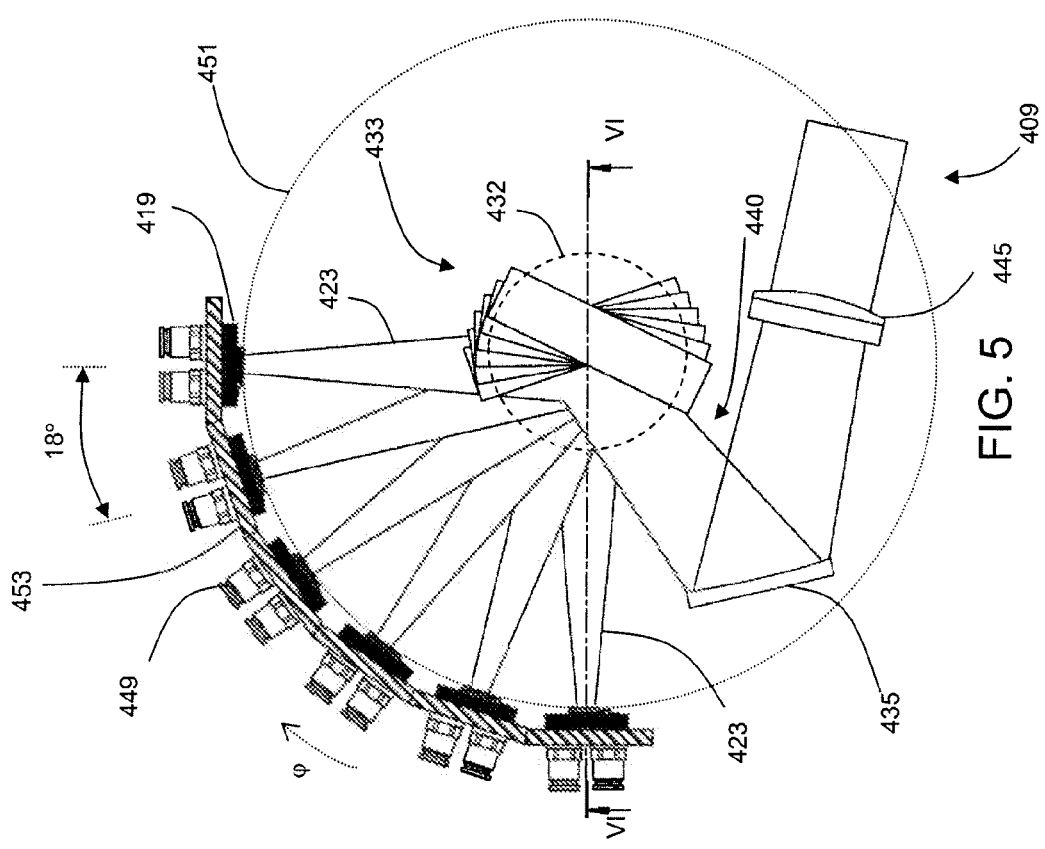
FIG. 5 is a top view of the laser system of FIG. 4.

To form the beam 409 from those laser beams 423, the beam forming optics 417 includes a reflector system 433 positioned in the center region 432. The reflector system 433 includes a stack of mirrors 439, with each of the mirrors 439 positioned at an angle relative to the adjacent mirrors 439 of the stack. Thus, for each source 419, the reflector system 433 includes mirrors that are displaced by the pitch p and that are oriented in the same direction so that the laser beams 423 of the corresponding source 419 are directed in the same direction. As can be seen in FIG. 4, the mirrors 439 for neighboring sources are neighboring as well. Accordingly, the orientation of the mirrors 439 changes mirror by mirror from a maximum incidence angle to a minimum incidence angle and then jumps back to the maximum incidence angle and so on. Thus, the reflector system 433 includes 6×12=72 mirrors 439. Each mirror 439 has a mirror area having a height and a width, where the height depends on the pitch and the number of beams that shall be interleaved and the required width depends on the incident angle. In the presented example of FIG. 4, the mirror area is chosen to be 1.66 mm×100 mm for interleaving six beams over a pitch of 10 mm. The mirrors 439 can have reflective coatings that are adapted to the specific incidence angles of the laser beams 423. The reflector system 433 redirects the incoming laser beams 423 to travel in a common direction towards an optical element 435 of the beam forming optics 417. In the embodiment of FIGS. 4 and 5, the optical element 435 is a cylindrical mirror.

Based on the cylinder-like shape of the arrangement 415, geometric relations can be described in a cylindrical coordinate system. An angular coordinate φ indicates the azimuth of incidence (e.g., the angular position of the source along the arc). A radial coordinate r indicates the radial distance to a center axis 437 of the cylindrical coordinate system. An axial coordinate z indicates the position along the center axis 437 of the cylindrical coordinate system.

Accordingly, each source 419 is associated with its angular coordinate. The distance of the sources 419 to the center axis 437 corresponds to its radial coordinate, and each emission region of the sources 419 is further associated with a respective axial coordinate. Moreover, the reflector system 433 of FIG. 4 can be grouped in sets of six individual mirrors 439 that are stacked on top of each other in the axial direction and are rotated relative to each other about the center axis 437 through the same angle thereby generating a fan-shaped arrangement. The fan-shaped arrangement repeats itself twelve times in axial direction.

To provide a sufficiently high reflectivity, the incidence angles of the light beams 423 onto the flat mirrors 439 can be limited to about 45°, wherein the incident angle is measured relative to the surface normal of the mirror surface. Then, the six sources 419 are positioned, for example, with an 18°-difference in the angular coordinate along the arc. Additionally, as described below in connection with FIG. 6, the sources 419 are mounted at differing axial coordinates, such that each laser beam 423 is emitted at its own specific axial coordinate. Therefore, each of the laser beams 423 propagates parallel to the radial direction associated with the angular coordinate of its source 419 towards the center region 432 and is then reflected by one of the flat mirrors 439 of the reflector system 433 towards the cylindrical mirror 435 such that one single (common) emission direction is formed through reflection. The laser beams 423, which are laterally offset with respect to each other in the axial direction, thereby combine into one common interleaved laser beam grouping 440. In the laser beam grouping 440, the individual laser beams 423 no longer extend radially next to each other; rather they are parallel to and on top of each other.

The cylindrical mirror 435 can form an entrance lens of a telescope system 441. A lens 443 forms the exit lens of the telescope system 441 and can additionally perform a collimation of the interleaved laser beam grouping 440 in the slow and fast axes. The reflector system 433 with the flat mirrors 439, the cylindrical mirror 435, and the lens 443 are part of the beam forming optics 417 that adjusts the various optical parameters of the laser beam grouping 413 and the interleaved laser beam grouping 440 to form and output the interleaved pump beam 409. Moreover, FIG. 4 shows coolant connections 449 for cooling the sources 419.

The top view of the interleaving laser system 411 shown in FIG. 5 illustrates further the arrangement 425 of the sources 419 along an arc segment of an imaginary circle 451. As shown, the laser beams 423 of the grouping 413 are directed using the beam forming optics 417 to form the interleaved beam 409. In addition, the optical path lengths of each of the laser beams 423 of the grouping 413 can be considered identical. The arrangement 415 is configured for identical sources 419 with, e.g., a pre-aligned emission angle of 90° with respect to a front side of the sources 419. Each source 419 is mounted to a wall segment 453 such that the emission regions of the laser diode bars is tangential to the surface of the imaginary circle 451 at the angular coordinate of the source 419 defined, e.g., by the center of the emission regions. Accordingly, the laser beams 423 of the grouping 413 propagate along approximately the same optical path length and experience approximately the same divergence within the interleaving laser system 411.

Figure 6:
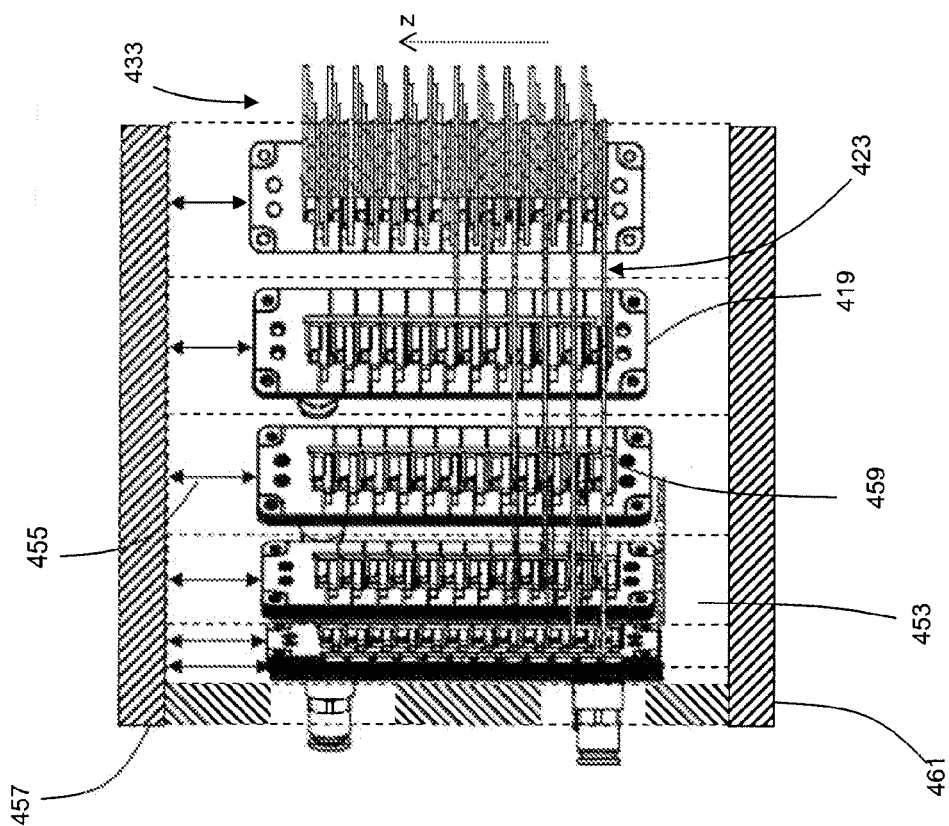
FIG. 6 is a side view of sources of the laser system of FIGS. 4 and 5.

The wall segments 453 include alignment pins for mounting the sources 419 in reproducible position. Thus, one can replace a source 419 without realigning the reflector system 433. In the embodiment of FIGS. 5 and 6, the wall segments 453 include mounts for mounting the sources 431 to be parallel to the axial direction.

FIG. 6 is a view taken along the direction VI-VI as shown in FIG. 5. Each of the six identical sources 419 is attached to the corresponding wall segment 453 at a position 455 that is axially offset relative to a housing top 457 and can be defined, for example, by alignment pins of the wall segments 453, which are adapted to fit into alignment holes 459 of the sources 419. Accordingly, the laser beams 423 are emitted at different axial coordinates between the housing top 457 and a housing bottom 461. The laser beams 423 of the grouping 413—each propagating at its own axial coordinate—interleave at the center region, where the laser beams 423 are reflected by the reflector system 433 to form the interleaved laser beam grouping 440. Thus, in the interleaving laser system 411, the individual laser beams 423 of all the sources 419 are guided one on top of the other, such that the radiation-free space 420 in the axial direction 437 of each of the sources 419 is at least partially filled with the laser beams 423 of the remaining sources 419.

Figure 8:
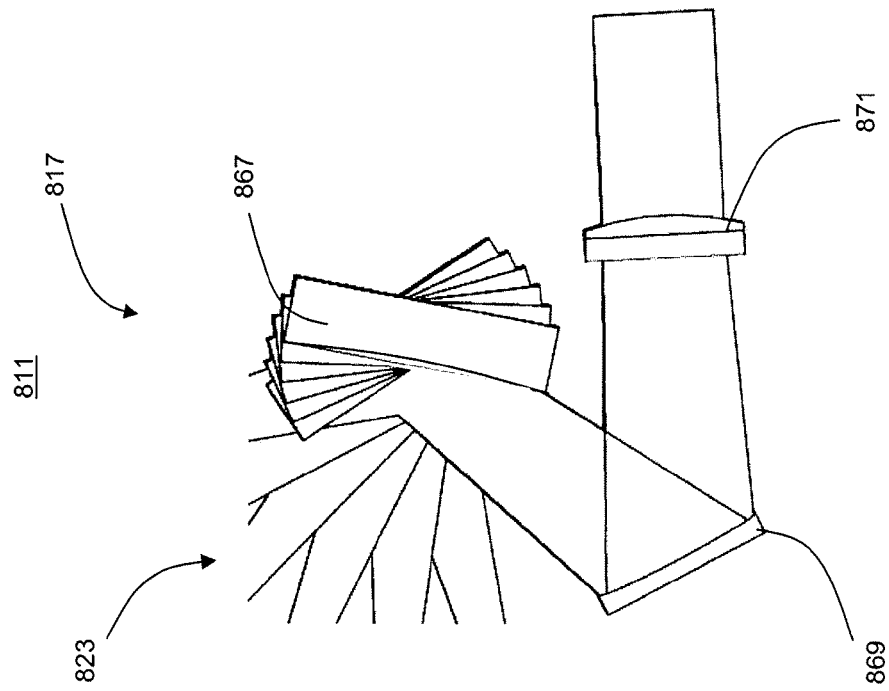
FIG. 8 is a top view of an implementation of a laser system with a second modification of a beam forming unit that can be used in the laser system of FIG. 1.
Figure 7:
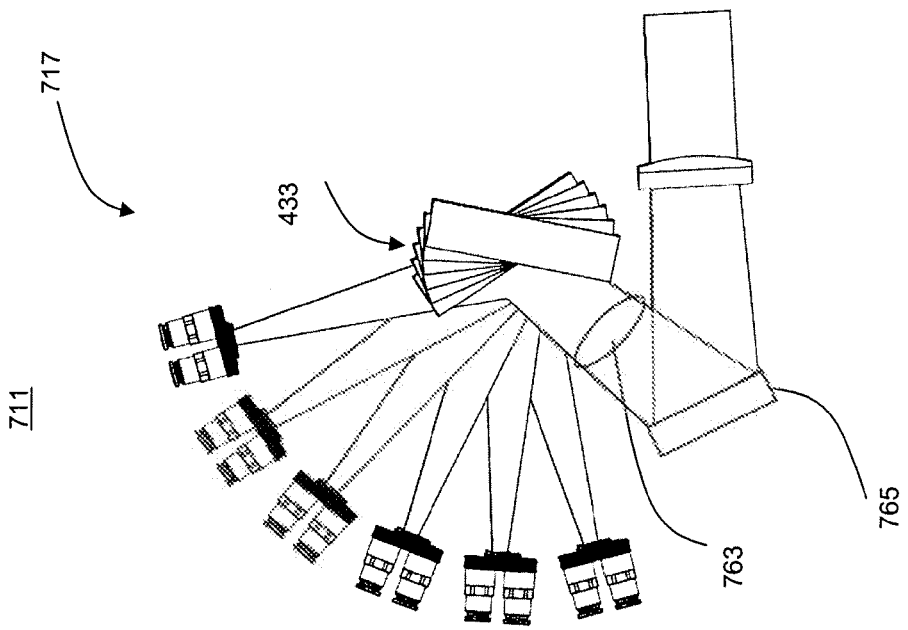
FIG. 7 is a top view of an implementation of a laser system with a first modification of a beam forming unit that can be used in the laser system of FIG. 1.

Referring to an interleaving laser system 711 of FIG. 7, additionally, or alternatively, the beam forming optics 717 can include a cylindrical lens 763 and a flat mirror 765 that perform the collimation of the slow axis. As another example as shown in FIG. 8, the beam forming optics 817 of a interleaving laser system 811 can include a reflector system of stacked parabolic mirrors 867 and a parabolic folding mirror 869, or a concave parabolic surface shape of a backside of a telescope lens 871. Additionally, the beam forming optics can include folding mirrors to provide a more compact telescope and/or a collimating optical system. For example, the cylindrical mirror 435 of FIG. 4 can be used as a folding mirror.

Before the interleaved laser beam 9 is, e.g., coupled into an optical fiber or a laser medium, additional optical components can be used to adapt and improve various beam parameters such as, for example, beam divergence, smoothness of the beam profile.

For high power applications, high power sources such as described in connection with FIGS. 9-12 can be used in the arrangement 15.

Figure 10:
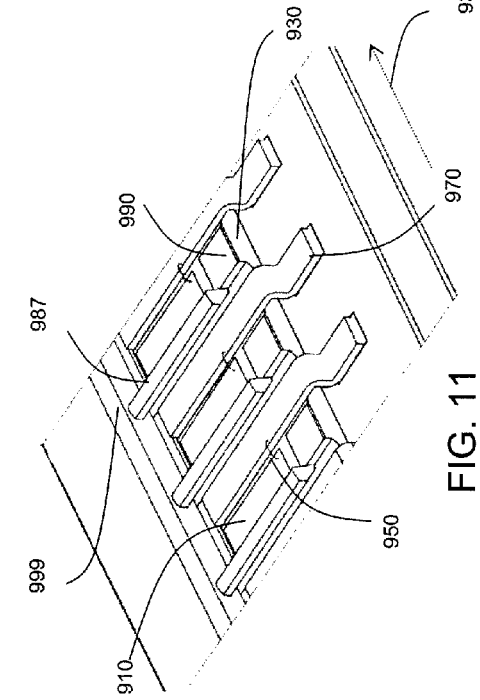
FIG. 10 is an enlarged cross-section of the source along cross-section X-X of FIG. 9 illustrating an emitting single laser diode taken.
Figure 11:
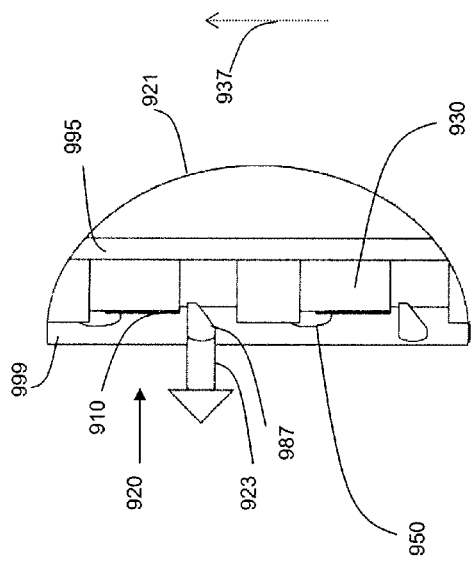
FIG. 11 is an enlarged perspective view of a section XI of the source of FIG. 9.
Figure 9:
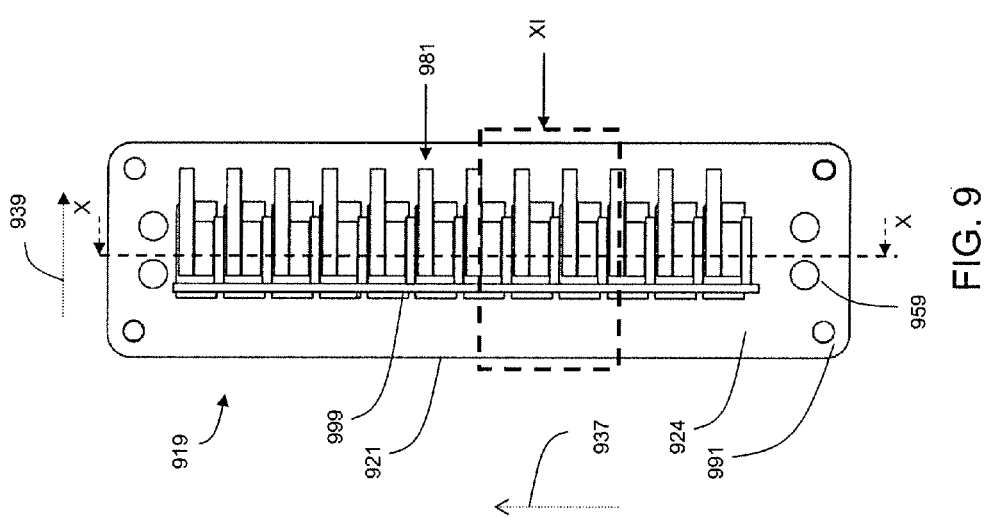
FIG. 9 is a front view of a source of the laser systems shown in FIGS. 4-7.

Referring to FIGS. 9-11, a flat source 919 includes twelve laser diode bar units 981, which each include a laser diode bar 920, a prism lens 987, and electrical connections 950. The diode laser bars 920 are arranged with a flat side onto a single piece rectangular heat sink 921. Therefore, the source is referred to as a flat source, in which each laser diode bar 920 can be efficiently cooled through the large area that is in thermal contact with the heat sink 921. Generated heat is removed from the flat sources 919 by a coolant being pumped through the heat sink 921 through the coolant connections at the backside as shown, e.g., in FIG. 4. Mount holes 991 are located at each corner and alignment holes 959 are located at the short sides of the rectangular heat sink 921.

The twelve laser diode bars 920 are arranged along a direction 937 of the length of the rectangular heat sink 921, which in FIG. 4 is arranged along the axial direction 437. The heat sink 921 has an insulating layer 995 as a top layer to electrically insulate the laser diode bars 920 from the heat sink 921. Each of the laser diode bars 920 includes a semiconductor structure 910 with an active region having multiple emitting regions. The semiconductor structure 910 is attached to a p-contact 930. Electrical connections 950, e.g. wire bonds, electrically connect the semiconductor structure 910 with an re-contact 970, and the n-contact 970 is electrically connected to the p-contact of a neighboring diode laser unit. Thus, when operating the source 919, the (identical) current flows serially through all laser diode bars 920. Additionally, each of the diode laser bars 920 can be controlled with a chip element 990.

Each of the semiconductor structures 910 has an elongated emitting surface 912, e.g., 30-45 neighboring active regions that are evenly distributed on a length of about 10 mm. Each emitting surface 912 is perpendicularly oriented to the heat sink 921 and has an emission direction along the direction 937. Thus, the laser diode bars 920 emit laser beams 923 essentially in the same plane, which is parallel to a planar surface 924 of the heat sink 921. Each laser beam 923 has an elongated beam profile, with its slow axis oriented in direction of the elongation of the emitting surface 912 of the laser diode bar 920, i.e., in a direction 939 of a width of the heat sink 921 (as similarly discussed above with respect to FIGS. 2 and 3), and initially a fast axis oriented in a direction perpendicular to the planar surface 924 of the heat sink 921.

The emitted laser beam 923 is internally reflected by the prism lens 987 and then propagates away from the heat sink 921 along a direction that is orthogonal to the surface 924 of the heat sink 921. Thus, after exiting the prism lens, the fast axis of the laser beams 923 is in the direction 937 along the length of the heat sink 921, while the direction of the slow axis of the laser diode bar 920 is not changed and remains along the direction 939. Additionally, the prism lens 987 collimates the laser beam 923 that is strongly divergent in the direction of the fast axis. The orientations of the prism lenses 987 are secured by a common glass mount 999.

The flat source 919 can have the following parameters. Each source 919 can provide an output power of about 1700 W based on twelve laser diode bars 920. The width of a laser diode bar 920 in the slow axis direction can be about 10 mm. The full-angle divergence of the laser beams 923 in the slow axis direction can be approximately 6°-10°. The emission in the fast axis direction from the individual laser diode bars 920 is achieved through an emission surface 912 having a height of approximately 1 μm. Initially, the laser beams 923 have a full-angle divergence of approximately 40°-70° in the fast axis direction. Each of the laser beams 923 emitted from each laser diode bar 920 is collimated in the fast axis direction using the prism lens 987. The collimated laser beams 923 typically extend about 0.6-1.2 mm in the fast axis direction. The full-angle divergence of the collimated laser beams 923 after passing through the prism lens 987 is approximately 0.5°-2° in the fast axis direction. The quality of the prism lens 987, the accuracy of the prism lens' alignment, and the straightness of the laser diode bar 920 determine the divergence angles.

Applying the flat sources 919 in the embodiment of the arrangement 15 of FIGS. 4-8, the fast-axes of the emitted laser beams 923 are oriented initially, i.e., when leaving the semiconductor structures 910, in the radial direction of the corresponding position of the flat source 919. After the reflection within the prism lenses 987, the fast axes of the emitted laser beams 923 are directed in the direction of the axial coordinate z.

Referring again to the flat source 919 of FIGS. 9-11, the pitch between two emitted laser beams 923 is about ten times larger then the size of the laser beam 923 when leaving the prism lens 987. Thus, about 9/10 of the cross-section of a beam of a flat source 919 is free from any laser radiation. Using the arrangement 15 and the beam forming optics 17, the laser radiation free part can be filled with laser beams 923 from other flat sources 919.

Figure 12:
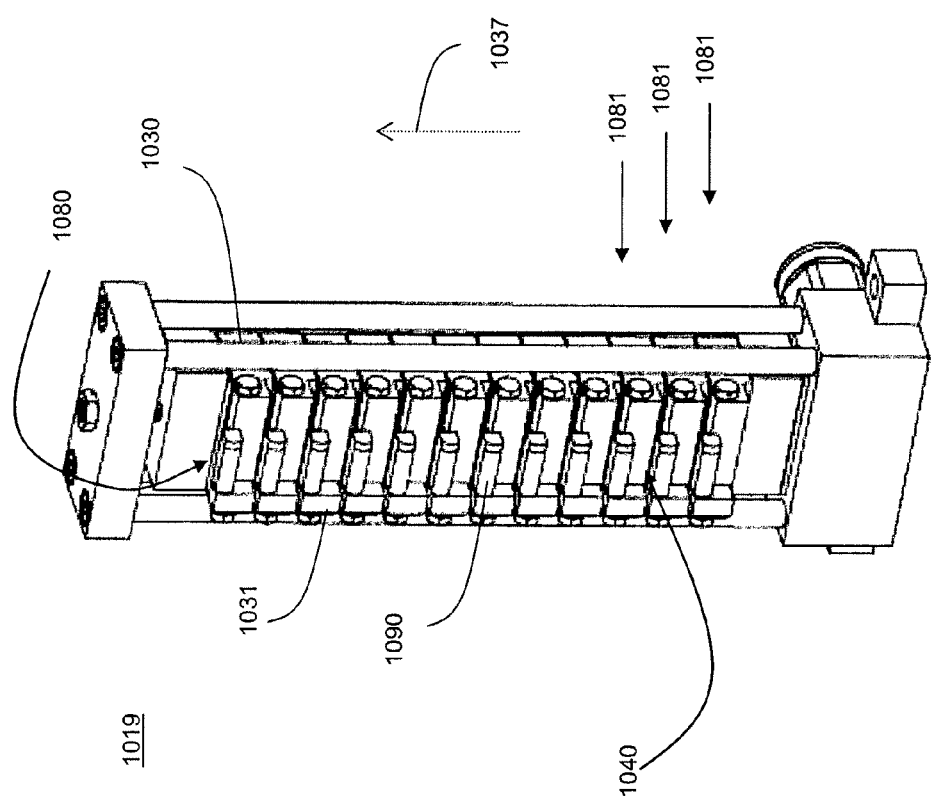
FIG. 12 is a perspective view of an alternative source that can be used in connection with the laser system shown in FIGS. 4-7.

An alternative high power source is shown in FIG. 12 in form of a group source 1019, in which multiple laser diode bar units 1081 are grouped together. In FIG. 12, for example, the group source 1019 includes 12 laser diode bar units 1081, which each include a laser diode bar 1020, a lens 1090, and electrical connections. Each of the diode laser bars 1020 is arranged on a surface of a cupper block 1030 and emits laser beams though a lens 1090 at a front side 1040 of the group source 1019. In a region behind the laser diode bars 1020, the neighboring cupper blocks 1030 are hold in tight contact such that the cupper bocks 1030 can be cooled with a common coolant system.

The twelve laser diode bars 1020 are arranged along a direction 1037 of the length of the group source 1019. Each of the laser diode bars 1020 includes a semiconductor structure with an active region having multiple emitting regions that form an elongated emitting surface. Each emitting surface is parallel to the front side 1040 of the group source 1019 and has an emission direction perpendicular to the front side 1040. Each laser beam has an elongated beam profile, with its slow axis oriented in direction of the elongation of the emitting surface of the laser diode bar 1020, and a fast axis in the direction 1037.

The lens 1090 collimates the laser beam that is strongly divergent in the direction of the fast axis. The orientations of the prism lenses 1090 can be secured by an extension 1031 of the cupper block 1030 or by a glass block that is attached to the cupper block 1030.

The group source 1019 can have beam parameters similar to the flat source 919.

As for the flat source 919 of FIGS. 9-11, the pitch between two emitted laser beams can be, for example, about ten times larger then the size of the laser beam when leaving the lens 1090. Thus, about 9/10 of the cross-section of a beam of a group source 1019 is free from any laser radiation. Using the arrangement 15 and the beam forming optics 17, the laser radiation free part can be filled with laser beams from other group sources 1019.

In the described arrangement 415, the sources can further be geometrically well aligned, as the contacting surface or contact points between the wall segments 453 and the heat sink can extend over the complete length of the sources 419 thereby providing a high angular precision of the alignment of the fast axis.

Various configurations can use the described concept to increase the number of integrated sources. For example, in FIG. 4, a second set of six sources 419 can be positioned on the other side of the cylindrical mirror 435. The cylindrical mirror 435 could then be positioned outside the circle 451 or could be replaced with a cylindrical lens.

Accordingly, other embodiments are within the scope of the following claims.

What is claimed is:

1. A laser system comprising:
   at least two sources, each source configured to provide at least two spatially separated laser beams; and
   a mount configured to mount the at least two sources along an arc, the arc defining an angular coordinate and a radial coordinate, wherein an axial coordinate is orthogonal to the angular coordinate and the radial coordinate, and the spatially separated laser beams are separated in the axial coordinate, the mount further configured to mount the at least two sources providing thereby an offset of the laser beams in the axial coordinate such that the laser beams interleave in the axial direction at a center region of the arc.

2. The laser system of claim 1 wherein one of the at least two sources is mounted for providing a laser beam that has an axial coordinate in between the axial coordinates of a pair of laser beams provided by another of the at least two sources.

3. The laser system of claim 1 further comprising an aligning optics positioned at the center region to direct the interleaved laser beams in a common direction.

4. The laser system of claim 3 wherein the aligning optics includes a stack of optical elements.

5. The laser system of claim 4 wherein neighboring optical elements of the stack of optical elements direct laser beams of different sources.

6. The laser system of claim 3 wherein the mount and the aligning optics are arranged to provide the same optical path length for the laser beams of the at least two sources.

7. The laser system of claim 1 wherein at least one of the sources includes a heat sink and two laser diodes.

8. The laser system of claim 7 wherein at least one of the laser diodes is arranged flat on the heat sink such that an emitting surface of the laser diode is perpendicular to the heat sink for emitting a laser beam parallel to the heat sink with a fast axis perpendicular to the heat sink.

9. The laser system of claim 8 wherein a deflecting optics is configured to deflect the laser beam being emitted parallel to the heat sink in a direction towards the center region.

10. The laser system of claim 7 wherein the laser diodes of one of the sources are electrically connected for supplying a current serially through all laser diodes.

11. The laser system of claim 1 wherein at least one of the sources includes a stack of laser diode units.

12. The laser system of claim 1 further comprising a beam forming optics positioned in the optical path of the interleaved laser beams after the aligning optics.

13. The laser system of claim 1 further comprising a beam forming optics, which is partially or completely incorporated in the aligning optics.

14. The laser system of claim 1 wherein the at least two sources are configured to provide multiple in the axial coordinate displaced laser beams with a pitch of at least the length of the laser diode in direction orthogonal to an emitting surface.

15. The laser system of claim 1 further comprising a collimating optics for at least one of a fast axis and a slow axis of the emitted laser beams.

16. The laser system of claim 1 wherein at least one of the at least two sources includes a laser diode bar.

17. The laser system of claim 16 wherein the laser diode bar includes between 20 and 50 emitting regions for emitting laser beams at the same axial coordinate.

18. The laser system of claim 17 wherein the emitting regions are arranged over a width of about 10 mm.

19. A method, the method comprising:
providing a first set of laser beams propagating in a radial direction towards a center region, the first set of laser beams being displaced in an axial coordinate of a cylindrical coordinate system; and
providing a second set of laser beams propagating in a radial direction of the cylindrical coordinate system towards the center region, the second set of laser beams being displaced in the axial coordinate,
wherein in the axial coordinate, the laser beams of the first set of laser beams is interleaved with the laser beams of the second set of laser beams.

20. The method of claim 19, further including pumping a laser medium with the interleaved laser beams.

21. A laser system, the system comprising:
at least two sources configured to provide at least two laser beams separated in an axial coordinate of a cylindrical coordinate system, the at least two sources being positioned along a circular arc at different angular coordinates and identical radial coordinates of the cylindrical coordinate system,
wherein at least one of the sources includes a laser diode and a deflecting optics, wherein the laser diode is configured to emit a first laser beam of the at least two laser beams along the axial direction having its fast axis along the radial coordinate, and the deflecting optics is configured to deflect the first laser beam in a direction towards a center region of the cylindrical coordinate system, thereby changing the fast axis into the direction along the axial coordinate.

22. The laser system of claim 21 wherein the direction of a slow axis of the first laser beam is tangentially to the circular arc.

* * * * *